United States Patent
Manjrekar et al.

(10) Patent No.: US 6,452,455 B2
(45) Date of Patent: Sep. 17, 2002

(54) CAPACITOR BIAS RECOVERY METHODOLOGY

(75) Inventors: Ashish T. Manjrekar; James Nodar, both of Dallas; Paul Emerson, Murphy; Bryan E. Bloodworth, Irving, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/904,073

(22) Filed: Jul. 12, 2001

Related U.S. Application Data

(60) Provisional application No. 60/219,892, filed on Jul. 21, 2000.

(51) Int. Cl.[7] ............................................. H03F 1/14
(52) U.S. Cl. ..................... 330/292; 330/296; 360/46; 360/67
(58) Field of Search ................... 330/292, 296; 360/46, 67

(56) References Cited

U.S. PATENT DOCUMENTS

| | | | | |
|---|---|---|---|---|
| 5,619,386 A | * | 4/1997 | Voorman et al. | 360/67 |
| 6,061,192 A | * | 5/2000 | Ogivara | 360/46 |
| 2002/0008584 A1 | * | 1/2002 | Manjrekar et al. | 330/296 |

* cited by examiner

*Primary Examiner*—Michael B Shingleton
(74) *Attorney, Agent, or Firm*—W. Daniel Swayze, Jr.; W. James Brady; Frederick J. Telecky, Jr.

(57) ABSTRACT

The present invention provides an apparatus, system and method of improving the bias response time for pre-amplifier circuits which utilize noise reduction capacitors 275. The system uses a quick recovery circuit 210 electrically connected to the capacitive node 216 of the pre-amplifier circuit. The quick recovery circuit 210 comprises a gain amplifier 218 with a resistive input and a controlled current source 219. The controlled current source corresponds to adjustments in a controlled current source 225 of the pre-amplifier and is electrically connected to the resistive input of the gain amplifier 218. The gain amplifier 218 can be selectively switched 211 to operatively connect an output to the capacitive node 216 of the pre-amplifier circuit.

20 Claims, 2 Drawing Sheets

CAPACITOR BIAS RECOVERY METHODOLOGY

CROSS REFERENCE TO RELATED APPLICATIONS

Priority is claimed of commonly assigned copending U.S. Provisional patent application, serial No. 60/219,892, filed Jul. 21, 2000, entitled "Capacitor Bias Recovery Methodology", the teachings included herein by reference.

BACKGROUND OF THE INVENTION

1. Technical Field of the Invention

The present invention relates to disk drive circuits and, more particularly, to an apparatus, system and method for biasing a pre-amplifier in a disk drive circuit.

2. Description of Related Art

One of the more exciting developments in magnetic recording on hard disk drives in recent years is the development of magneto resistive (MR) sensors or heads. The phenomenon of magneto resistance has been known for a long time. The basic effect is that when a magnetic field is applied to a MR material the resistance of the material changes. Thin film strips of Permalloy exhibit magneto resistivity between two and three percent of the intrinsic resistivity of the material. Because of the accumulated knowledge and significant magneto resistance, a thin film of Permalloy became the material of choice for the research of MR sensors for recording applications.

Conventional magnetic storage devices include a magnetic transducer or head suspended in close proximity to a recording medium; for example, a magnetic disk having a plurality of concentric tracks. The transducer is supported by a flexible to suspension. During normal operation, relative motion is provided between the transducer and the recording medium as an actuator dynamically positions the transducer over the desired track.

Writing data to the recording medium is typically performed by applying a current to a coil of the head so that a magnetic field is induced in an adjacent magnetically permeable core, with the core transmitting a magnetic signal across a spacing of the disk to magnetize a small pattern or digital bit of the media within the disk.

Reading of the information in the disk is performed by sensing the change in magnetic field of the core as the transducer passes over the bits in the disk. The changing magnetic field induces a voltage or current in the inductively coupled coil. Reading of the information can be accomplished by employing a magneto resistive head, which has a resistance that varies as a function of the magnetic field adjacent to the sensor. Connected to these heads are read circuits, such as a reading pre-amplifier, which amplify the recorded data and reduce noise. Assuming that the disk track has previously written data, the following sequence of events converts them into user bits: first, as magnetic poles pass near the head gap, the core of the head becomes magnetized; and second, the change in magnetism in the core results in an electric signal across the head coil. These electric signals are subsequently amplified and after a series of other operational steps results in usable data supplied to a computing processor.

For many years, several important issues related to making MR heads such as different biasing schemes, biasing recovery time, and noise reduction, for example, have been investigated. The pursuit of higher density storage devices has resulted in increased noise. Circuit consideration such as noise reduction capacitors can be utilized to reduce noise and improve the signal-to-noise ratio, however, the noise reduction capacitors also slow the bias recovery time of the circuit.

A problem in current disk storage circuits is the extreme sensitivity to electrical noise. In disk storage circuits, the signal is relatively small, thus, additive electrical noise can make detection of data difficult. To address the problem, noise reduction components, such as capacitors, are utilized to improve the signal-to-noise ratio of the circuits. However, these capacitors can also slow the bias response time and speed of the disk storage device. Therefore, what is needed is a system and method for decreasing the bias response time for those circuits which utilize noise reduction capacitors.

SUMMARY OF THE INVENTION

The present invention achieves technical advantages as an apparatus, system and method of decreasing the bias response time for pre-amplifier circuits which utilize noise reduction capacitors. The system uses a quick recovery circuit with an output which is selectively switched to operatively connect to a node of the noise reduction capacitor. The quick recovery circuit is electrically connected in parallel to the noise reduction capacitor and comprises a resistor, an amplifier, and a mirrored current source. The resistor value is selected to closely match the resistance of the reference resistor of the pre-amplifier circuit. The mirrored current source is arranged to closely follow the current adjustments made at the current source of the pre-amplifier circuit. The output of the amplifier serves as a feedback loop and is electrically connected to a reference node of the pre-amplifier circuit.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses of innovative teachings herein. In general, statements made in the specification of the present application do not necessarily delimit any of the various claimed inventions. Moreover, some statements may apply to some inventive features, but not to others.

Figure 1:
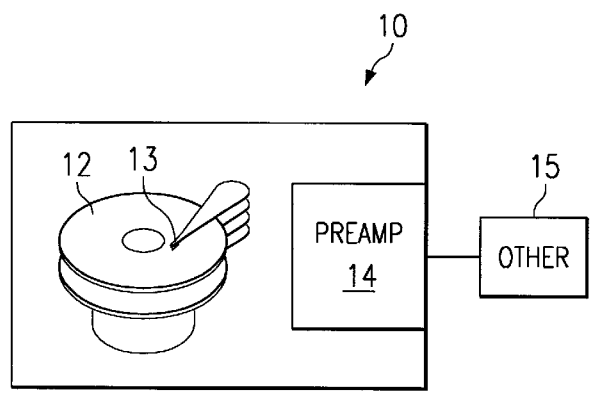
FIG. 1 illustrates a prior art disk drive mass storage system.

Referring now to the drawings and more particularly to FIG. 1, there is illustrated an example of a prior art disk drive mass storage system 10. The disk storage system 10 includes a disk assembly 12, a read/write head assembly 13, a pre-amplifier 14 and other circuitry 15. The disk assembly 12 includes a number of rotating platters used to store data that is represented as magnetic transistors on the magnetic platters. Read/write head assemblies 13 are used to store and retrieve data from each side of the magnetic platters. Read/write head assemblies 13 may comprise any type of available read/write heads such as a magneto resistive (MR) head. Pre-amplifiers 14 serve as interfaces between the read/write head assembly 13 of the disk assembly 12 and other circuitry, and provides amplification to the wave form data signals as needed.

During read operations, analog data signals are received from the read/write head assembly 13 through the preamplifier 14. Pre-amplifier circuits are typically designed to accommodate a number of MR heads. Other MR heads can be oriented in a cascode type configuration. The cascode stage and other head input stages have been omitted for clarity. With a multiple MR head arrangement, the common section of the circuitry is multiplexed to read only the activated or biased MR head. For data reading MR heads, the bias is typically shut off while the head is not used, so as to increase the longevity in view of electro migration and decrease power consumption. Therefore, to begin a reading operation, a selected MR head must first be properly biased before reliable data can be realized. Thus, decreasing the time required for proper biasing will increase the efficiency of operations.

Figure 2:
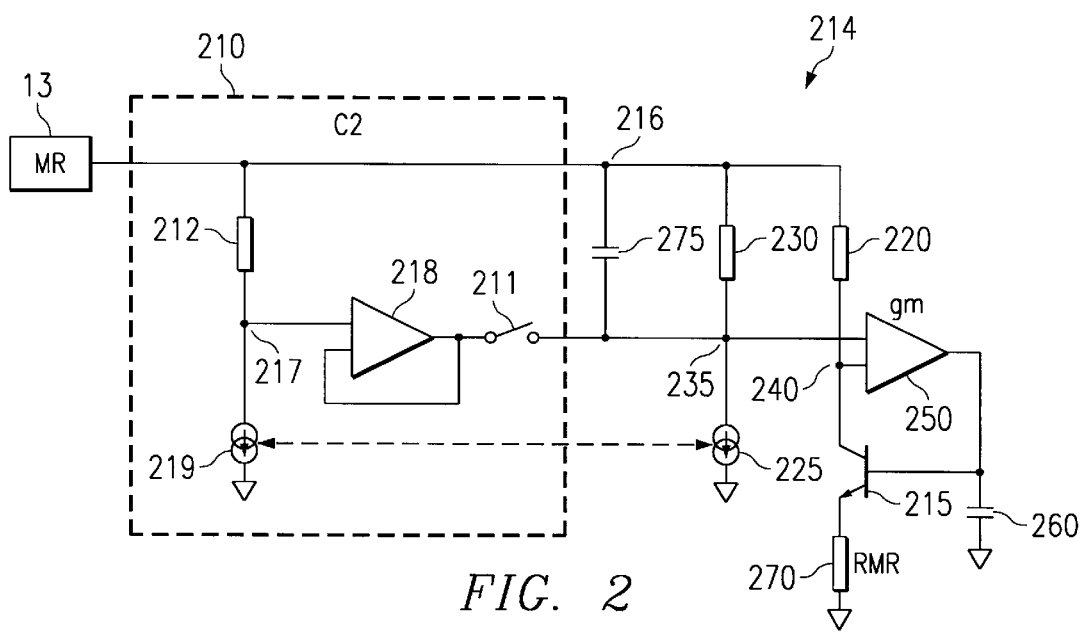
FIG. 2 illustrates a pre-amplifier circuit which includes a quick recover circuit in accordance with the present invention.

Referring now to FIG. 2, there is illustrated a pre-amplifier circuit generally shown at 214 which includes a quick recovery circuit 210 in accordance with the present invention. The pre-amplifier circuit includes a bipolar transistor 215 having an emitter, collector, and base, with the collector connected via signal resistor 220 to a magneto resistive head 13. The RMR 270 is generally in the range of 25 to 65 ohms. A current source or current digital analog converter 225 is serially connected to a reference resistor 230 which is connected in parallel to the signal resistor 220. Amplifier 250 develops an electrical signal by comparison of voltage on reference node 235 and signal node 240, to which an electrical signal is output by the amplifier 250 and develops a corresponding charge on a capacitor 260 which biases the transistor 215. The capacitance of capacitor 260 is generally in the range of two to four nanofarads.

The current source 225 provides bias current and current flow reflected through a series of elements to the magneto resistive head or RMR 270. The current source 225 is designed to supply approximately two to ten milliamps. However, it is not desirable to run a large current through signal resistor 220 because of resultant heating and excessive power consumption. Therefore, the values of the reference resistor 230 and the signal resistor 220 are chosen to have a ratio such that current through the signal resistor 220 is only a fraction of the current of the current source 225 and resistor 230. For example, the reference resistor 230 can be set to approximately 8400 ohms and the signal resistor 220 can be set to approximately 420 ohms (20:1 ratio) thereby reducing the current through signal resister 220 to approximately one twentieth the current of source 225. Other resistive values can also be chosen to similarly reduce the current generated through signal resistor 220.

A key concern in the transmission and storage of electronic information is noise. In the case of disk storage, the signal generated corresponding to retrieved data is relatively small, thus, additive noises can make detection of data difficult or result in unacceptable errors. The commonly recognized metric in the industry is the signal-to-noise ratio. A higher signal-to-noise ratio results in a more robust drive. The pursuit of higher density storage devices has resulted in increased noise and a lower signal-to-noise ratio. Circuit consideration such as noise reduction capacitors can be utilized to reduce noise and improve the signal-to-noise ratio. To reduce electrical noise in the pre-amplifier 214, a capacitor (C2) 275 is connected in parallel to the reference resistor 230. For example, a good noise reduction capacitor of merit should be approximately 400 picofarads. Though C2 275 reduces electrical noise in the circuit, it also slows the bias response of the circuit 214. A slower bias response results in a slower biasing of the magneto resistive head and extends the period before reliable data can be collected.

In accordance with the present invention, a quick recovery circuit 210 is inserted into the pre-amplifier circuit 214. The quick recovery circuit 210 includes a resistor 212 with a first side connected to a node 216 and a second side connected to an input of unity gain amplifier 218 at node 217. The resistor 212 is chosen to have a resistance closely matching the resistance of reference resistor 230. The output of the unity gain amplifier 218 electrically connects to reference node 235 and also as a feedback loop to the unity gain amplifier 218. In a preferred embodiment, the quick recovery circuit 210 also includes an electric switch 211. In another embodiment, the switch 211 can be mechanically operative. Through switch 211, the quick recovery circuit 210 can be selectively coupled to operatively connect to the pre-amplifier circuit.

The quick recovery circuit 210 also includes a current source 219 or current digital to analog (DAC) device which is electrically connected to node 217. The current source 219 of the quick recovery circuitry 210 is designed to mirror the output of current source 225 of the pre-amplifier circuit. Thus, each current source current value increases or decreases in unison by equivalent amounts upon each adjustment. In another embodiment, the current sources can be combined into a single current source. Advantageously, as the current is increased or decreased through the mirrored current source 219, the voltage at node 217 correspondingly changes without delay. This un-delayed change of voltage, input into the unity gain amplifier 218, causes node 235 to charge more quickly by boosting charge current to capacitor C2 which decreases bias response.

Figure 3:
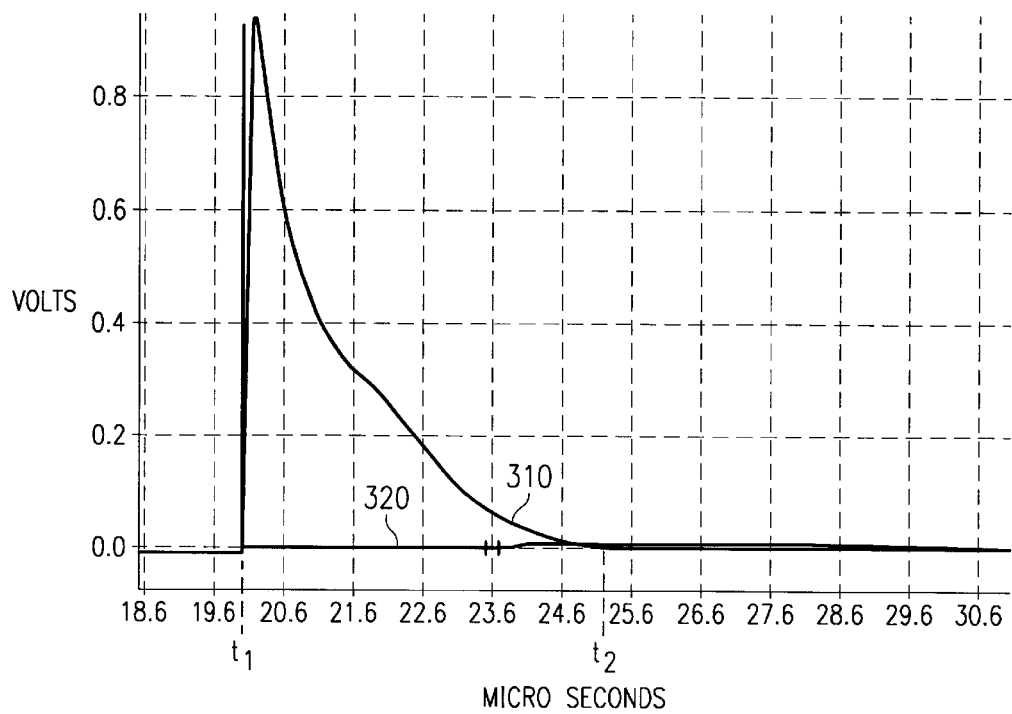
FIG. 3 illustrates a timing chart depicting voltage excursions resulting from current adjustments.

The advantages of the present invention can be appreciated by referring now to FIG. 3, where there is illustrated a timing chart which depicts voltage excursions as the bias current is adjusted or changed. A first voltage response 310 illustrates the bias response as the current is switched from approximately 2 milliamps to approximately 8.2 milliamps in a pre-amplifier circuit without the quick recovery circuit 210, and a second voltage response 320 illustrates the bias response using the quick recovery circuit 210. At approximately the 20 microsecond mark, shown at t1, a current adjustment is made. The first voltage response 310 initially spikes to a voltage over 0.8 volts with a gradual decrease over time to the final recovery point or settling point around 0 volts depicted at time t2. Since, during this voltage excursion period, the MR head 13 cannot reliably be used to collect data from the storage device 12, the circuit must be allowed to settle at time t2 before data collection begins.

Using the quick recovery circuit 210, the second voltage response 320 also exhibits an initial voltage spike over 0.8 volts, however, the recovery or settling to 0 volts is almost immediate due to the current boost provided by unity gain amplifier 218. Thus, the MR head 13 can be used to collect data from the storage device much more quickly. Additionally, since larger or extended voltage excursions increase power consumption and heating of the operational devices, use of the quick recovery circuit 210 decreases power consumption and/or increase operational life of the devices.

Figure 4:
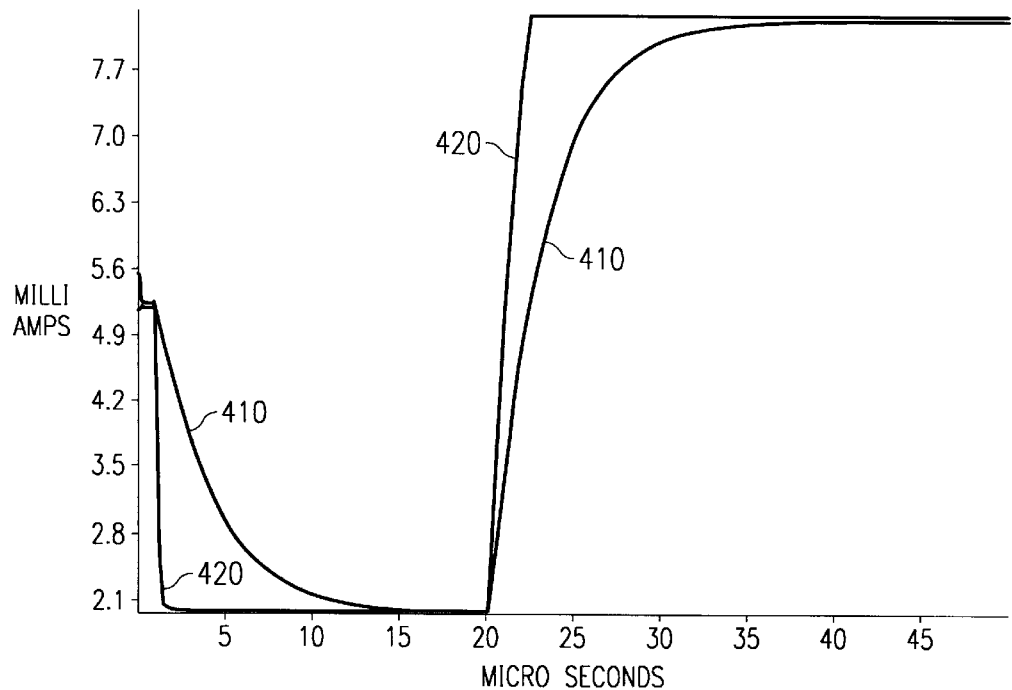
FIG. 4 illustrates a timing chart depicting current response resulting from the recovery scheme illustrated in FIG. 2.

Referring now to FIG. 4, there is illustrated a timing chart depicting current response through MR head 13. Initially, a current is decreased from approximately five milliamps to approximately 2.1 milliamps though current source 225. A first current response 410 illustrates a current response without the quick recovery circuit 210, and a second current response 420 illustrates a current response using the quick recovery circuit 210. The first current response 410 exhibits a gradual decrease to the 2.1 milliamp target which takes approximately 13 microseconds to settle after the current adjustment is made. The time to settle is chosen as the time it takes to reach approximately 95 percent of the target current level. With the addition of the quick recovery circuit 210, the second current response 420 exhibits a rapid decrease to the 2.1 milliamp target which only takes approximately two to three microseconds to settle after the current adjustment. Thus, there is a response improvement of approximately 10 microseconds, roughly an 80% decrease in recovery time.

Subsequently, current source 225 is increased to a target of approximately 8.4 milliamps and again the first current response 410 takes approximately 13 microseconds to respond to the new target current. With the addition of the quick recovery circuit 210, the second current response 420 exhibits a rapid increase to the 8.4 milliamp target with a response time of approximately two to three microseconds. This quick recovery enables C2 275 to respond more rapidly to control changes in the current source 225 thus reducing the time to settle after a current adjustment. Consequently, the MR head 13 can be employed to retrieve reliable data from the storage medium more quickly with the addition of the quick recovery circuit 210.

Although a preferred embodiment of the apparatus, system and method of the present invention has been illustrated in the accompanied drawings and described in the foregoing detail description, it will be understood that the invention is not limited to the embodiments disclosed, but is capable of numerous rearrangements, modifications, and substitutions without departing from the spirit of the invention as set forth and defined by the following claims.

What is claimed is:

1. A quick recovery circuit for a pre-amplifier having a noise reduction capacitor and a reference resistor, comprising;
    a resistor having a first side coupled to a first side of said noise reduction capacitor;
    an amplifier having a first and second input, said resistor having a second side coupled to said first input of said amplifier, an output of said amplifier coupled to a second side of said noise reduction capacitor and said second input of said amplifier; and
    a mirrored current source coupled to said first input of said amplifier.

2. The quick recovery circuit of claim 1 further including a switch operatively connected to said pre-amplifier to selectively couple said quick recovery circuit to a reference node of said pre-amplifier.

3. The quick recovery circuit of claim 1, wherein said quick recovery circuit resistor is set to a resistance value approximately equal to a resistive value of said preamplifier reference resistor.

4. The quick recovery circuit in claim 1 electrically connected in parallel to said noise reduction capacitor.

5. The quick recovery circuit in claim 1, wherein said mirror current source is a current DAC.

6. The quick recovery circuit of claim 1, wherein said pre-amplifier includes further includes a current source, said mirrored current source operable to apply a current proportional to an applied current output.

7. The quick recovery circuit of claim 6, wherein said pre-amplifier current source and said mirrored current source are controlled by a current DAC.

8. The quick recovery circuit of claim 1, wherein said mirrored current source is adjustable.

9. A method of reducing bias recovery time of a capacitive node in a pre-amplifier comprising a reference resistor, a noise reduction capacitor, and a current source, said method comprising:
    connecting a quick recovery control loop to said pre-amplifier capacitive node, said quick recovery control loop including gain amplifier with a resistive input and a controlled current source;
    matching said resistive input of said gain amplifier with said reference resistor in said pre-amplifier;
    adjusting said controlled current source of said quick recovery control loop to proportionally correspond to a current adjustment made through said current source of said pre-amplifier; and
    applying an electric signal of said gain amplifier to said capacitive node of said pre-amplifier.

10. The method of claim 9 further comprising selectively switching said quick recovery control loop in parallel with said noise reduction capacitor.

11. The method of claim 9, wherein said controlled current source of said quick recovery control loop comprises a current DAC.

12. The method of claim 9 further comprising controlling said controlled current source of said quick recovery control loop and said current source of said pre-amplifier with a current DAC.

13. The method of claim 9, wherein said connecting said quick recovery control loop to said capacitive node is operably selectable through an electric switch.

14. The method of claim 9, wherein said gain amplifier is a unity gain amplifier.

15. A system for reducing bias recovery time of a capacitive node in a pre-amplifier having a controlled current source and a reference resistor, comprising:
    a unity gain amplifier having a resistive input; and
    a current circuit having an ouput and operable to supply a controlled current to said resistive input of said unity gain amplifier, wherein said controlled current is responsive to adjustments of said controlled current source of said pre-amplifier.

16. The system of claim 15 further comprising a switch for selectively switching an output of said unity gain amplifier to operatively connect said output to said capacitive node of said pre-amplifier.

17. The system of claim 15 further comprising a matching circuit operably configured to match a resistance of said unity gain amplifier resistive input to a resistance of said reference resistor of said pre-amplifier.

18. The system of claim 15, wherein said current circuit comprises a current DAC.

19. The system of claim 15, wherein said current circuit and said controlled current source of said pre-amplifier comprises a current DAC.

20. The system of claim 15, wherein said current circuit comprises a current mirror.

* * * * *